US012600236B2

(12) United States Patent
Lee

(10) Patent No.: US 12,600,236 B2
(45) Date of Patent: Apr. 14, 2026

(54) VEHICLE MONITOR DEVICE

(71) Applicant: HYUNDAI MOBIS CO., LTD., Seoul (KR)

(72) Inventor: Kyeong Jun Lee, Seoul (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 210 days.

(21) Appl. No.: 18/531,842

(22) Filed: Dec. 7, 2023

(65) Prior Publication Data

US 2024/0391321 A1     Nov. 28, 2024

(30) Foreign Application Priority Data

May 25, 2023     (KR) ........................ 10-2023-0067483

(51) Int. Cl.
*H05K 5/02* (2006.01)
*B60K 35/55* (2024.01)
*B60R 16/03* (2006.01)

(52) U.S. Cl.
CPC ............. *B60K 35/55* (2024.01); *B60R 16/03* (2013.01); *H05K 5/0217* (2013.01); *B60K 2360/68* (2024.01)

(58) Field of Classification Search
CPC .... H05K 5/0017; H05K 5/0217; B60K 35/55; B60R 16/03
USPC .......................................................... 361/807
See application file for complete search history.

(56) References Cited

U.S. PATENT DOCUMENTS

2009/0085383 A1* 4/2009 Hicks ..................... B60K 35/60
297/217.3
2023/0044285 A1* 2/2023 Jin ........................ G06F 1/1652

FOREIGN PATENT DOCUMENTS

JP          2001180390 A  *  7/2001  ............. B60R 11/02
KR   10-2009-0005585 A        1/2009
KR       200445233 Y1  *  7/2009  ........... F16M 11/046

* cited by examiner

*Primary Examiner* — Hung S. Bui
(74) *Attorney, Agent, or Firm* — Novo TechIP International PLLC

(57)     ABSTRACT

Disclosed is a vehicle monitor device wherein, when a wire is pulled and released by operations of an actuator, a monitor plate operates in a telescoping structure such that the length in the upward/downward direction is varied, and a monitor moves straightly upwards/downwards with regard to the monitor plate, thereby implementing an open mode and a closed mode.

9 Claims, 11 Drawing Sheets

VEHICLE MONITOR DEVICE

CROSS-REFERENCE TO RELATED APPLICATIONS

This application is based on and claims priority under 35 U.S.C. 119 to Korean Patent Application No. 10-2023-0067483, filed on May 25, 2023, in the Korean Intellectual Property Office, the disclosure of which is herein incorporated by reference in its entirety.

TECHNICAL FIELD

The present disclosure relates to a vehicle monitor device and, more specifically, to technology regarding a vehicle monitor device, wherein a monitor is configured to move straightly upwards/downwards through a telescoping structure such that an open mode and a closed mode can be implemented.

BACKGROUND

Vehicles include monitors as display devices for implementing an audio video navigation (AVN) system, and the monitors come in various types such as an embedded type (embedded in the dashboard between the driver seat and the front passenger seat), a room mirror type, a ceiling type, a headrest-embedded type, and an external type.

Monitoring devices which are fixed such that they are basically immovable (fixed structure) have problems in that the field of view of the driver or passengers is obstructed, and the exterior is not aesthetic.

In an attempt to solve the problems of the fixed structure, movable-structure monitoring devices have been proposed, which are hidden and stored when not used, and which are protracted and exposed only when used.

Most conventional movable-structure monitoring devices have a driving device for moving the monitor, which is based on a rack-and-pinion driving scheme in most cases. Alternatively, a lead screw driving scheme is used, or a hinge-based link driving scheme is used. Such a conventional structure has problems in that the driving device need an excessive operating space and thus is disadvantageous to a package, a separate component is necessary to reinforce the insufficient rigidity, excessive noise occurs, and the structure is vulnerable to vibrations.

The foregoing described as the background art is intended merely to aid in the understanding of the background of the present disclosure, and is not intended to mean that the present disclosure falls within the purview of the related art already known to those skilled in the art.

SUMMARY

An aspect of the present disclosure is to provide a vehicle monitor device having a monitor configured to move straightly upwards/downwards through a telescoping structure which uses a wire during an operation of an actuator, thereby implementing an open mode and a closed mode, such that the minimized operating space is advantageous to a package compared with conventional structures, rigidity can be secured without additional components, and an aesthetic appearance is provided by applying a wire structure which is robust against noise and vibration.

In accordance with an aspect of the present disclosure, a vehicle monitor device may include: an actuator fixed to a case; a wire connected to the actuator so as to transfer operating power from the actuator; a monitor plate connected to the wire such that, when the wire is pulled and released, the length of the monitor plate is varied in a telescoping structure; and a monitor coupled to the monitor plate, an end of the wire being connected to the monitor such that, when the wire is pulled and released, the monitor moves straightly upwards/downwards while being guided by the monitor plate.

The actuator may be a bidirectional motor capable of rotating clockwise and counterclockwise.

The actuator may be fixed to the lower end center of the case, and a driving pulley may be provided at a rotating shaft of the actuator such that the wire is wound therearound.

The monitor plate may include a fixed plate fixed to the case and connected to the wire, and a movable plate coupled to the monitor and connected to the wire while overlapping the fixed plate in the forward/backward direction such that, when the wire is pulled and released, the movable plate moves upwards/downwards while being guided by the fixed plate. The monitor may be coupled to the movable plate to be able to move upwards/downwards.

Fixed plate pulleys may be rotatably coupled to upper and lower ends of left and right sides of the fixed plate, respectively, movable plate pulleys may be rotatably coupled to upper and lower ends of left and right sides of the movable plate, respectively, the wire may have a first end connected to a driving pulley rotated by power from the actuator, and the wire may have a second end connected to the monitor via one fixed plate pulley and one movable plate pulley successively.

The fixed plate pulleys and the movable plate pulleys may be spaced apart in the forward/backward direction to avoid collision between the pulleys and are configured to have center axes positioned eccentrically in the leftward/rightward direction.

Fixed plate guide protrusions may be formed on left and right surfaces of the fixed plate, respectively, so as to protrude inwards; movable plate guide grooves may be formed on left and right surfaces of the movable plate, respectively, such that the fixed plate guide protrusions are inserted therein; movable plate guide protrusions may be formed on the left and right surfaces of the fixed plate, respectively, so as to protrude inwards; monitor guide grooves may be formed on left and right surfaces of the monitor, respectively, such that the movable plate guide protrusions are inserted therein; and the fixed plate guide protrusions, the movable plate guide grooves, the movable plate guide protrusions, and the monitor guide grooves may be all formed to extend in the upward/downward direction.

Push rods may be provided on left and right upper ends of the movable plate, respectively, so as to protrude upwards; leaf springs may be provided on left and right upper ends of the case and positioned to match with ends of the push rods, respectively; if the movable plate moves upwards and thus protrudes, the push rods may pressurize the leaf springs such that the leaf springs are compressed; and when the movable plate moves downwards, the compressed springs may be restored and push the push rods with an elastic force, thereby supplementing the force necessary for the initial downward movement of the movable plate.

The wire, the wire/monitor plate connecting structure, and the wire/monitor connecting structure may be configured to have left-right symmetry with reference to the actuator.

The wire may be pulled and wound around the driving pulley by operations of the actuator, the movable plate may move upwards with regard to the fixed plate as the wire is pulled, and if the monitor moves upwards with regard to the movable plate and finishes the upward movement, the monitor may reach an open mode in which the monitor protrudes upwards. If the wire is released by operations of the actuator, the monitor may move downwards by means of own weight concurrently releasing of the wire, the movable plate may move downwards with regard to the fixed plate and overlap the fixed plate in the forward/backward direction, and the monitor may finish the downward movement and reach a closed mode.

The vehicle monitor device according to the present disclosure is advantageous as follows: when the wire is pulled and released by operations of the actuator, the fixed plate moves straightly upwards/downwards with regard to the movable plate, the monitor plate thus operates in a telescoping structure, and the monitor moves straightly upwards/downwards with regard to the movable plate, thereby implementing an open mode and a closed mode. This is advantageous for a package by minimizing the operating space compared with a conventional structure based on a rack-and-pinion driving scheme, a lead screw driving scheme, or a link driving scheme.

There is another advantage in that an aesthetic appearance can be provided by applying a wire structure which is robust against noise and vibration.

There is another advantage in that operational stability and reliability can be secured by applying two (left and right) telescoping structures, and it is possible to secure the maximum open length of the monitor compared with a minimum package.

In addition, sufficient rigidity and rigidity can be secured by using a steel-based fixed plate and a movable plate. This is advantageous in that, since no separate reinforcement member is necessary, the number of components, the weight, and the material cost can be reduced.

BRIEF DESCRIPTION OF THE DRAWINGS

The above and other aspects, features, and advantages of the present disclosure will be more apparent from the following detailed description taken in conjunction with the accompanying drawings, in which:

FIG. 2 is a rear view of FIG. 1;

FIG. 4 is a rear view of FIG. 3;

Figure 5:
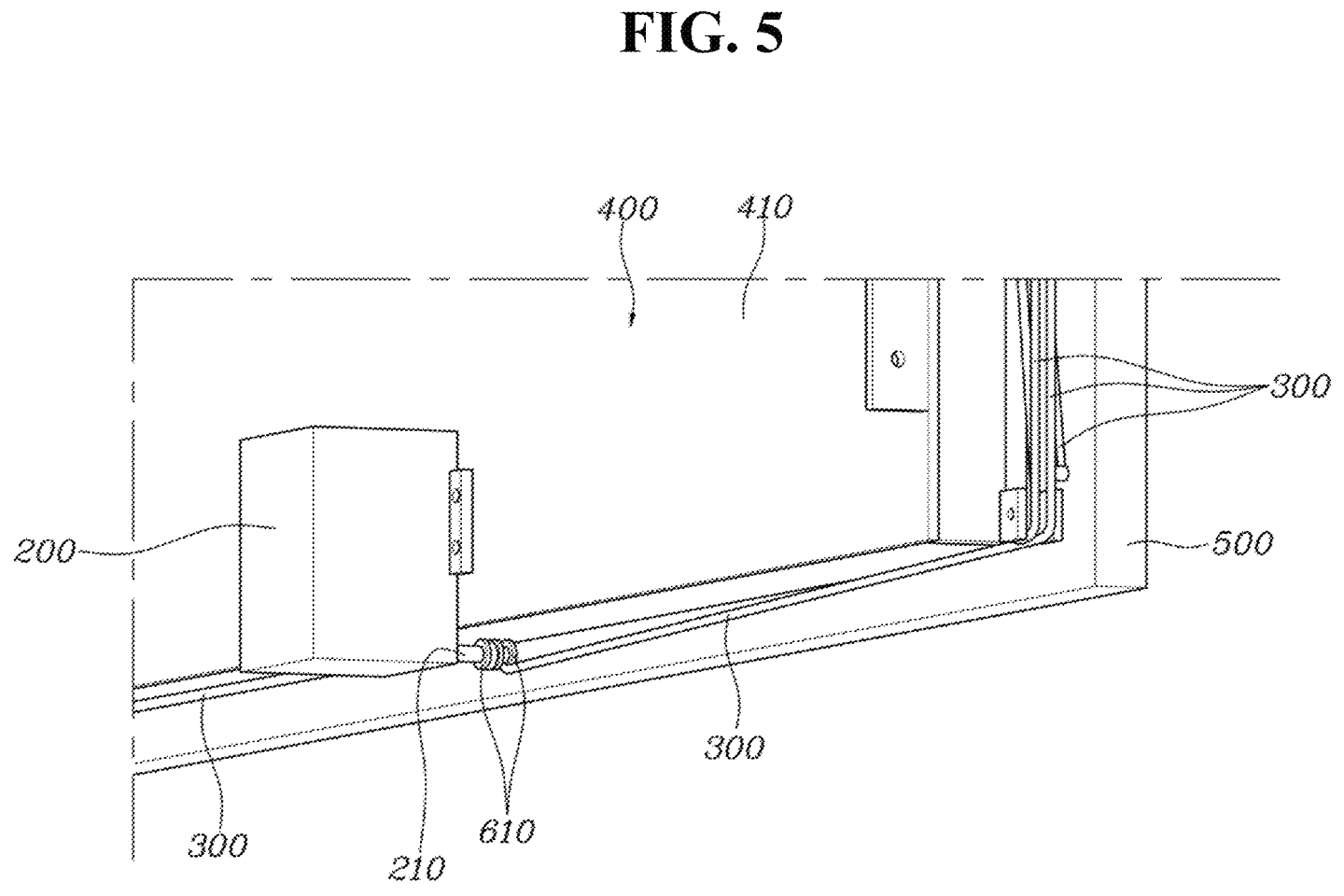

FIG. 5 illustrates an actuator and a driving pulley according to the present disclosure;

DETAILED DESCRIPTION

Figure 1:
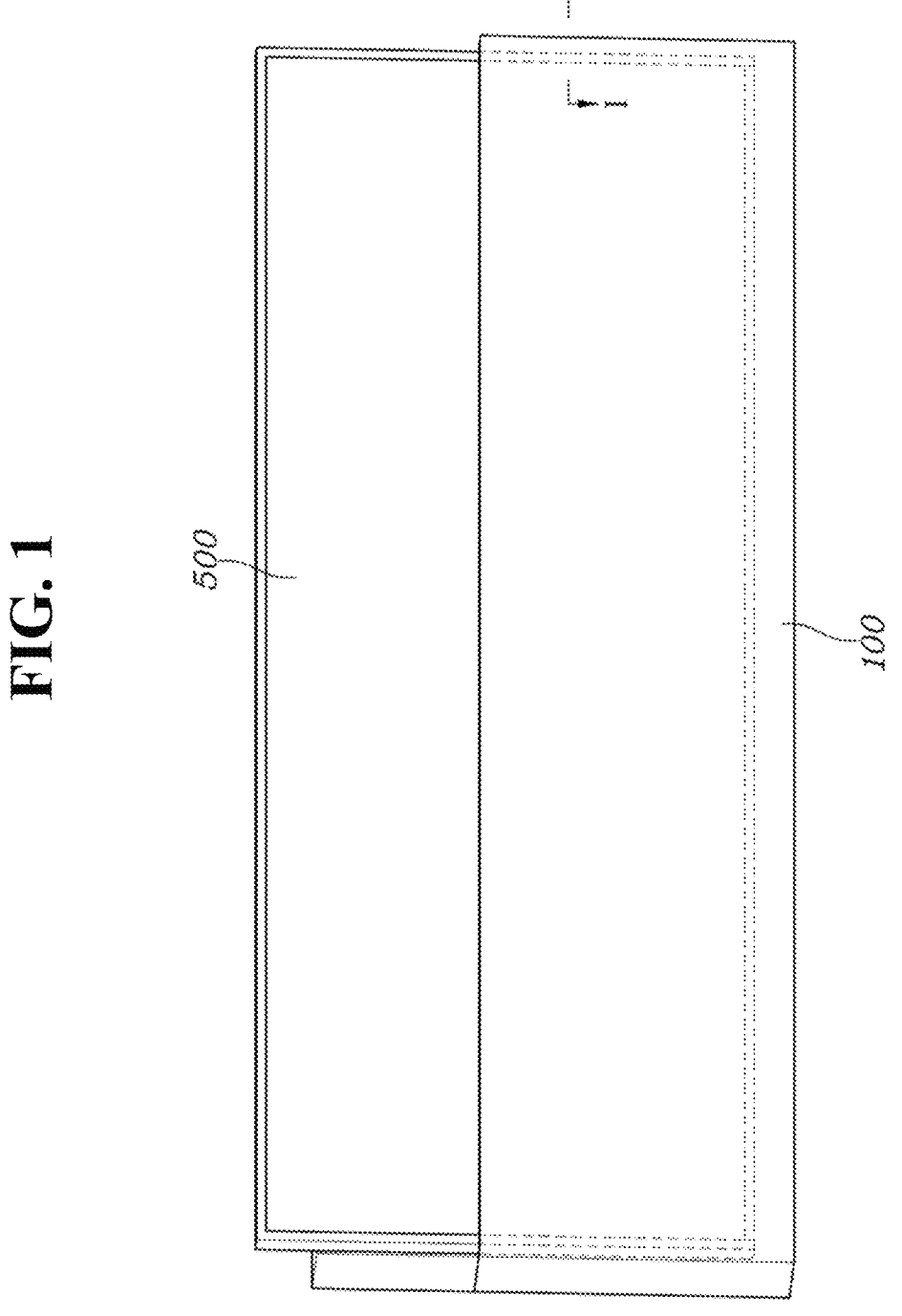
FIG. 1 is a front view of a vehicle monitor device according to the present disclosure in a closed mode state of the monitor.

Hereinafter, embodiments disclosed in the present specification will be described in detail with reference to the accompanying drawings, and the same or similar elements are given the same and similar reference numerals, so duplicate descriptions thereof will be omitted.

The terms "module" and "unit" used for the elements in the following description are given or interchangeably used in consideration of only the case of writing the specification, and do not have distinct meanings or roles by themselves.

In describing the embodiments disclosed in the present specification, when the detailed description of the relevant known technology is determined to unnecessarily obscure the gist of the present disclosure, the detailed description may be omitted.

Furthermore, the accompanying drawings are provided only for easy understanding of the embodiments disclosed in the present specification, and the technical spirit disclosed herein is not limited to the accompanying drawings, and it should be understood that all changes, equivalents, or substitutes thereof are included in the spirit and scope of the present disclosure.

Terms including an ordinal number such as "first", "second", or the like may be used to describe various elements, but the elements are not limited to the terms. The above terms are used only for the purpose of distinguishing one element from another element.

In the case where an element is referred to as being "connected" or "coupled" to any other element, it should be understood that another element may be provided therebetween, as well as that the element may be directly connected or coupled to the other element.

In contrast, in the case where an element is "directly connected" or "directly coupled" to any other element, it should be understood that no other element is present therebetween.

A singular expression may include a plural expression unless they are definitely different in a context.

As used herein, the expression "include" or "have" are intended to specify the existence of mentioned features, numbers, steps, operations, elements, components, or combinations thereof, and should be construed as not precluding the possible existence or addition of one or more other features, numbers, steps, operations, elements, components, or combinations thereof.

A unit or a control unit included in the name "Motor Control Unit (MCU)", "Hybrid Control Unit (HCU)", etc. is merely a term widely used for naming a controller configured to control a specific function of a vehicle, but does not mean a generic function unit.

the controller may include a communication device configured to communicate with a sensor or another control unit, a memory configured to store an operation system, a logic command, or input/output information, and at least one processor configured to perform determination, calculation, decision or the like which are required for responsible function control.

Hereinafter, a vehicle monitor device according to an exemplary embodiment of the present disclosure will be described with reference to the accompanying drawings.

A vehicle monitor device according to the present disclosure is configured such that, as illustrated in FIG. 1 to FIG. 11, a monitor plate 400 operates in a telescoping structure by means of operations of an actuator 200 and a wire 300, and a monitor 500 coupled to the monitor plate 400 moves linearly in a vertical direction, thereby implementing an open mode (popup mode) and a closed mode (hidden mode).

That is, a monitor device according to the present disclosure includes: an actuator 200 fixed to a case 100; a wire 300 connected to the actuator 200 so as to transfer operating power from the actuator 200; a monitor plate 400 connected to the wire 300 such that, when the wire 300 is pulled and released, the length of the monitor plate 400 is varied in a telescoping structure; and a monitor 500 coupled to the monitor plate 400 and connected to an end of the wire 300 such that, when the wire 300 is pulled and released, the monitor 500 moves linearly in a vertical direction while being guided by the monitor plate 400.

The monitor device according to the present disclosure is configured such that the wire 300, the wire 300/monitor plate 400 connecting structure, and the wire 300/monitor 500 connecting structure have left-right symmetry with reference to the actuator 200, thereby ensuring that, when the monitor 500 moves in a vertical direction, the left and right sides operate simultaneously (with no time difference), thereby improving operating stability.

The case 100 may be fixedly installed on (or attached to) the dashboard between the driver seat and the front passenger seat, on the headrest, or on the vehicle roof, and may not be exposed to the outside in the installed state. This may help provide an aesthetic appearance.

The actuator 200 is attached to or fixedly installed at the bottom center of the case 100 and is covered by the monitor plate 400 such that the same is not exposed to the field of view of passengers.

The actuator 200 is preferably a bidirectional motor capable of rotating clockwise and counterclockwise, but is not limited thereto.

A single actuator 200 is configured, and has a single rotating shaft 210 configured to rotate.

Tow driving pulleys 610 are coupled to the single rotating shaft 210 such that the single rotating shaft 210 and the two driving pulleys 610 rotate together.

One end of a right wire 300 is connected to one of the driving pulleys 610, and one end of a left wire 300 is connected to the other driving pulley 610.

If the rotating shaft 210 is rotated by operations of the actuator 200, the right wire 300 and the left wire 300 are pulled together and thus simultaneously wound around the driving pulleys 610 or simultaneously released from the driving pulleys 610.

The monitor plate 400 includes a fixed plate 410 fixed to the case 100 and connected to the wire 300, and a movable plate 420 coupled to the monitor 500 and connected to the wire 300 while overlapping the fixed plate 410 in the forward/backward direction such that, when the wire 300 is pulled and released, the movable plate 420 moves in the upward/downward direction while being guided by the fixed plate 410.

The fixed plate 410 and the movable plate 420 are formed in the shape of rectangular panels extending in the leftward/ rightward direction and are mode of a steel material so as to have a sufficient level of strength and rigidity. This is advantageous in that, since no separate reinforcement member is necessary, the number of components, the weight, and the material cost can be reduced.

The fixed plate 410 is disposed on the lower end of the case 100 and fixedly coupled to the case 100. The movable plate 420 is disposed so as to overlap the fixed plate 410 in the forward/backward direction.

The direction in which the screen of the monitor 500 is positioned may be the front, and the opposite direction may be the rear. Alternatively, the front and rear may be defined inversely.

If the wire 300 is pulled by operations of the actuator 200 and wound around the driving pulleys 610, and if the movable plate 420 is pulled by pulling the wire 300, the movable plate 420 moves linearly in an upward direction with regard to the fixed plate 410 and thus protrudes while being guided by the fixed plate 410.

On the other hand, if the wire 300 is released from the driving pulleys 610 by operations of the actuator 200, the movable plate 420 drops by its own weight as the wire 300 is released and thus overlaps the fixed plate 410 in the forward/backward direction.

When the wire 300 is pulsed and released by operations of the actuator 200 as described above, the fixed plate 410 moves linearly in a vertical direction with regard to the movable plate 420, and the monitor plate 400 thus operates in a telescoping structure, thereby varying the upward/ downward length thereof. This is advantageous for a package by minimizing the operating space compared with a conventional structure based on a rack-and-pinion driving scheme, a lead screw driving scheme, or a link driving scheme.

There is another advantage in that an aesthetic appearance is provided by applying a wire structure robust against noise and vibration.

The left and right sides of the movable plate 420 surround the left and right sides of the rear portion of the monitor 500 such that the monitor 500 is coupled to the movable plate 420 to be able to move in a vertical direction.

Fixed plate pulleys 411 are rotatably coupled to the upper and lower ends of the left and right sides of the fixed plate 410, respectively. Movable plate pulleys 421 are rotatably coupled to the upper and lower ends of the left and right sides of the movable plate 420, respectively.

One end of the wire 300 is connected to a driving pulley 610 which is rotated by power from the actuator 200, and the other end thereof is connected to the monitor 500 via a fixed plate pulley 411 and a movable plate pulley 421 successively.

That is, the other end of the wire 300 extends along the lower periphery of the underlying fixed plate pulley 411 and extends upwardly/upwards. The other end of the wire 300 then extends along the upper periphery of the overlying fixed plate pulley 411 and extends downwardly/downwards. The other end of the wire 300 then extends along the lower periphery of the underlying movable plate pulley 421 and extends upwards. The other end of the wire 300 then extends along the upper periphery of the overlying movable plate pulley 421 and extends downwards. The other end of the wire 300 is finally fixedly connected to the monitor 500.

Therefore, when the wire 300 is pulled and released by operations of the actuator 200, movements of the wire 300 are facilitated by rotations of the fixed plate pulleys 411 and the movable plate pulleys 421, thereby facilitating upward/ downward movements of the movable plate 420 and the monitor 500.

Figure 7:
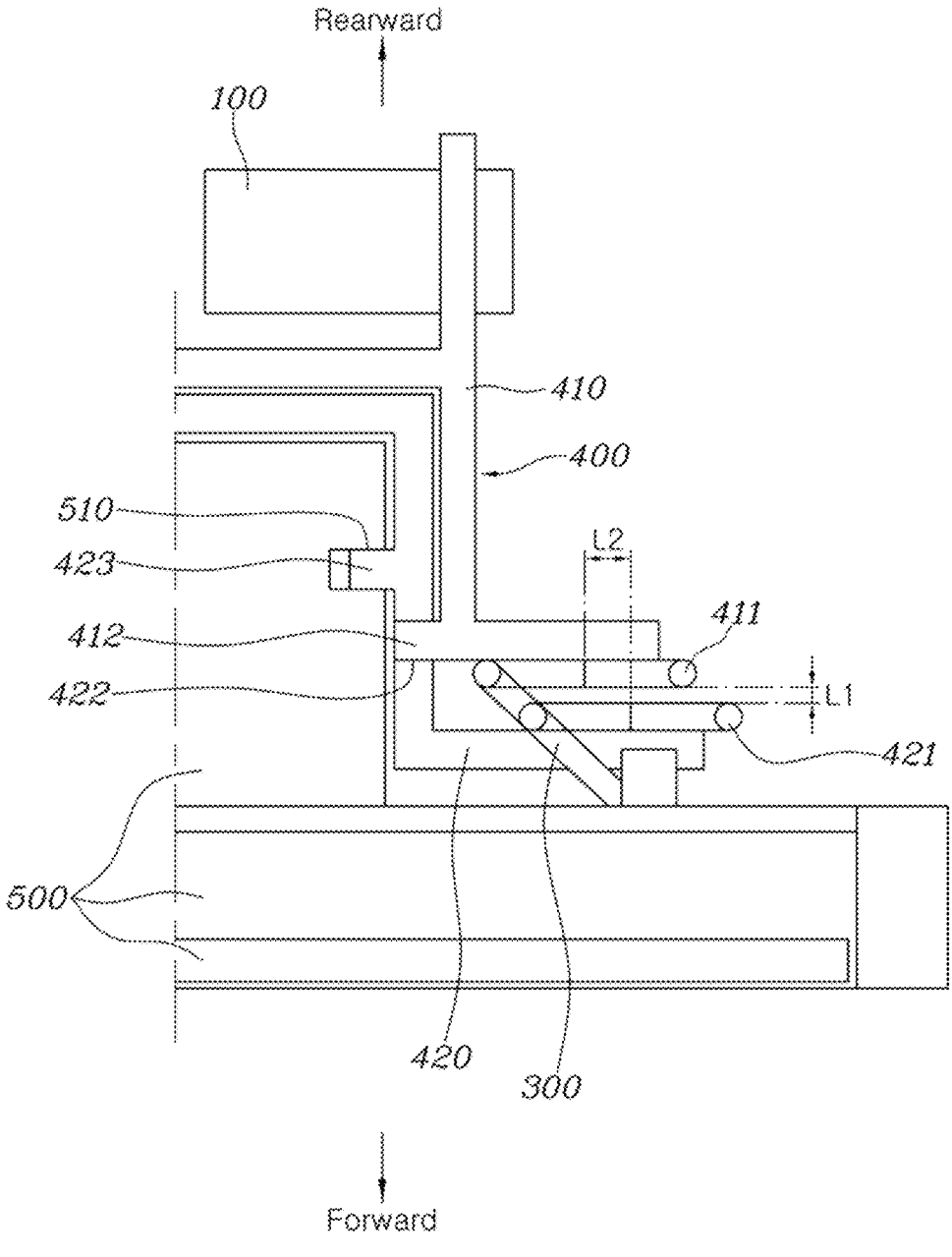
FIG. 7 is a sectional view taken along line I-I in FIG. 1.
Figure 8:
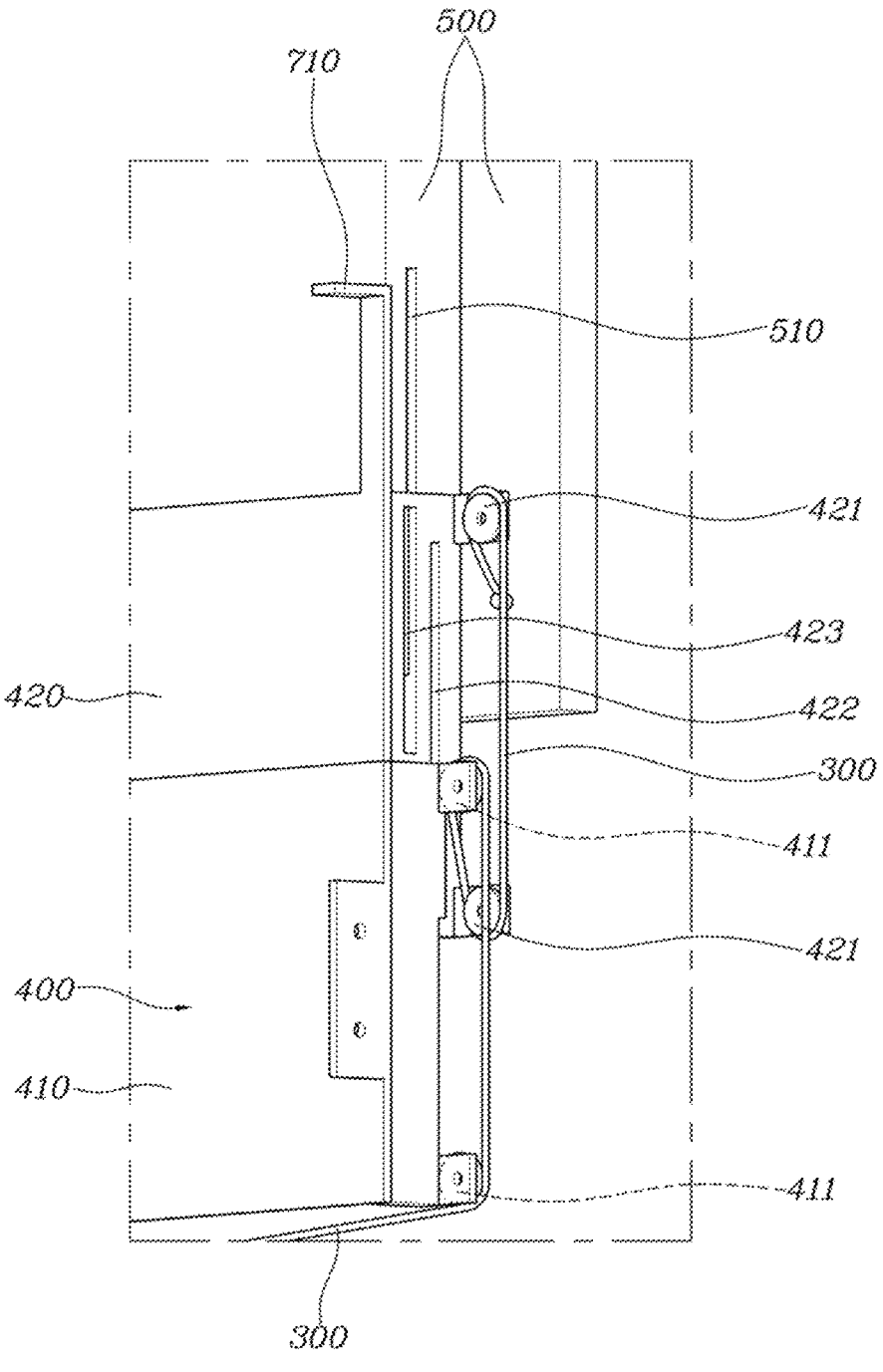
FIG. 8 illustrates the state of a monitor plate, a wire, and a monitor in an open mode state of the monitor.
Figure 9:
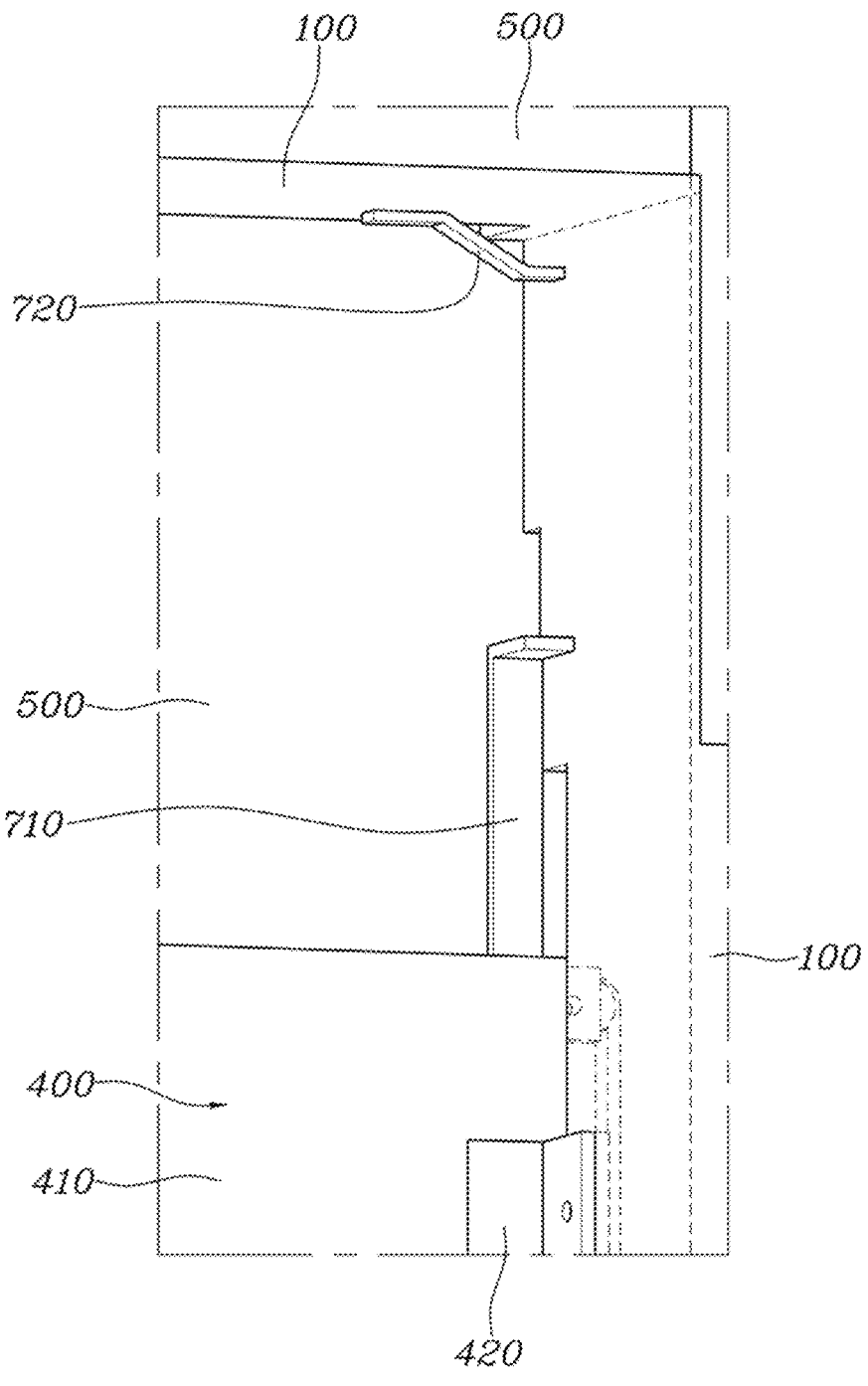
FIG. 9 illustrates the state of a push rod and a leaf spring in a closed mode state of a monitor.

According to the present disclosure, the fixed plate pulleys 411 and the movable plate pulleys 421 are positioned to be spaced apart by a predetermined interval L1 in the forward/backward direction as illustrated in FIG. 7, in order to avoid collision between the pulleys, and are positioned to be spaced apart by a predetermined interval L2 such that the center axes of the pulleys are positioned eccentrically in the leftward/rightward direction.

Accordingly, collision between the fixed plate pulleys 411 and the movable plate pulleys 421 can be avoided when the movable plate 420 moves in a vertical direction with regard to the fixed plate 410, thereby improving durability, and preventing the occurrence of noise due to contact between the pulleys, in particular.

Upward/downward movements of the movable plate 420 and the monitor 500 and guided by coupling between protrusions and grooves.

That is, fixed plate guide protrusions 412 are formed on the left and right surfaces of the fixed plate 410 so as to protrude inwards, respectively. Movable plate guide grooves 422 are formed on the left and right surfaces of the movable plate 420, respectively, such that the fixed plate guide protrusions 412 are inserted therein. Movable plate guide protrusions 423 are formed on the left and right surfaces of the movable plate 420, respectively. Monitor guide grooves 510 are formed on the left and right surfaces of the monitor 500, respectively, such that the movable plate guide protrusions 423 are inserted therein.

The fixed plate guide protrusions 412, the movable plate guide grooves 422, the movable plate guide protrusions 423, and the monitor guide grooves 510 are all formed to extend in the upward/downward direction such that, when the wire 300 is pulled and released by operations of the actuator 200, upward/downward movements of the movable plate 420 and the monitor 500 are facilitated.

According to the present disclosure, push rods 710 are provided on the left and right upper ends of the movable plate 420 so as to protrude upwards. Leaf springs 720 are provided on the left and right upper ends of the case 100 and are positioned to match with ends of the push rods 710, respectively.

The push rods 710 are formed to have L-shaped sections (the upper ends thereof are bent) such that the area of contact between ends of the push rods 710 and the leaf springs 720 is increased.

First ends of the leaf springs 720 are fixedly coupled to the left and right upper ends of the case 100, respectively, and second ends thereof are bent toward the push rods 710 (downwards) such that, when an external force is applied, they are moved upwards and are compressed, thereby accumulating an elastic force, and if the external force is removed, they restore the original shape and transfer the elastic force to counterpart components.

Figure 10:
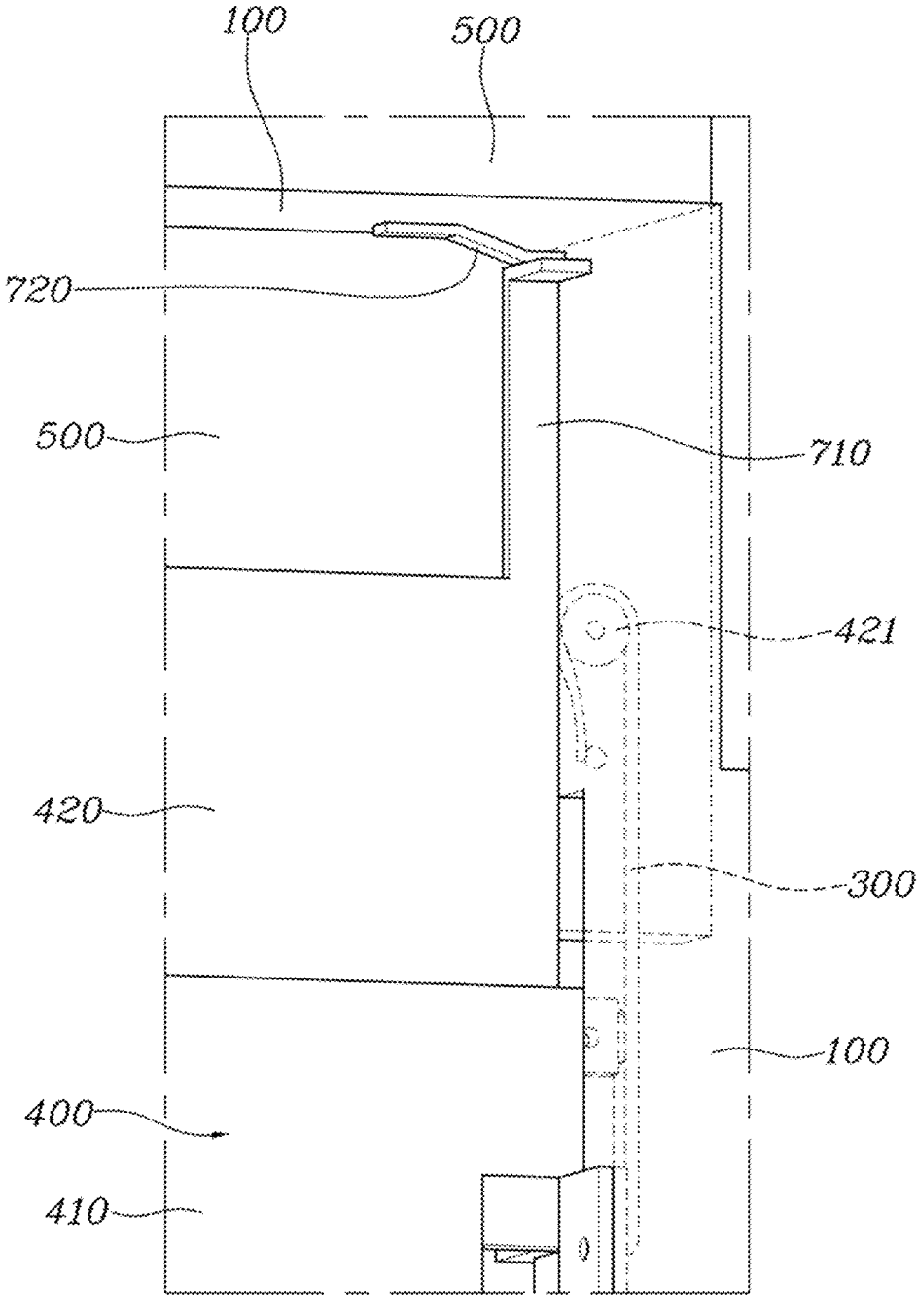
FIG. 10 illustrates the state of a push rod and a leaf spring in an open mode state of a monitor.
Figure 11:
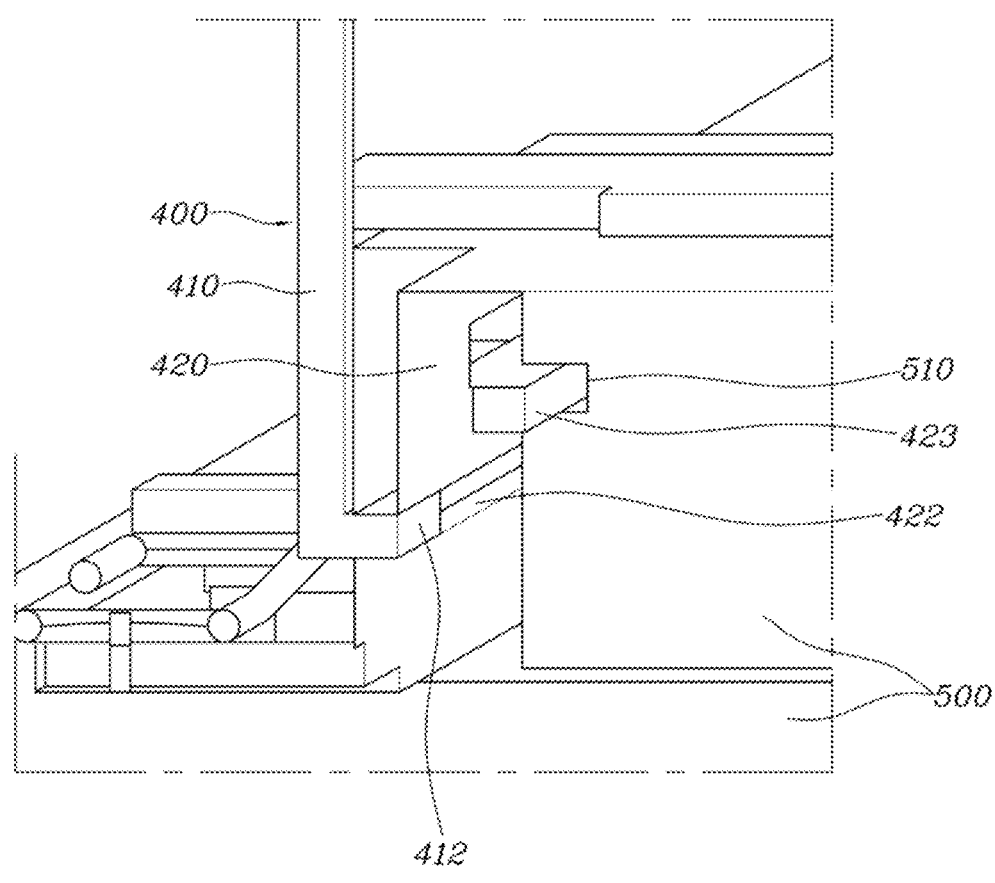
FIG. 11 illustrates a monitor plate and a monitor guide structure according to the present disclosure.

Therefore, if the movable plate 420 moves upwards and protrudes, as illustrated in FIG. 10, as the wire 300 is pulled by operations of the actuator 200, the push rods 710 pressurize the leaf springs 720, which are then compressed. If the movable plate 420 moves downwards as the wire 300 is released by operations of the actuator 200, the compressed leaf springs 720 are restored, and the resulting elastic force pushes the push rods 710, thereby supplementing the for necessary for initial downward movement of the movable plate 420.

Figure 3:
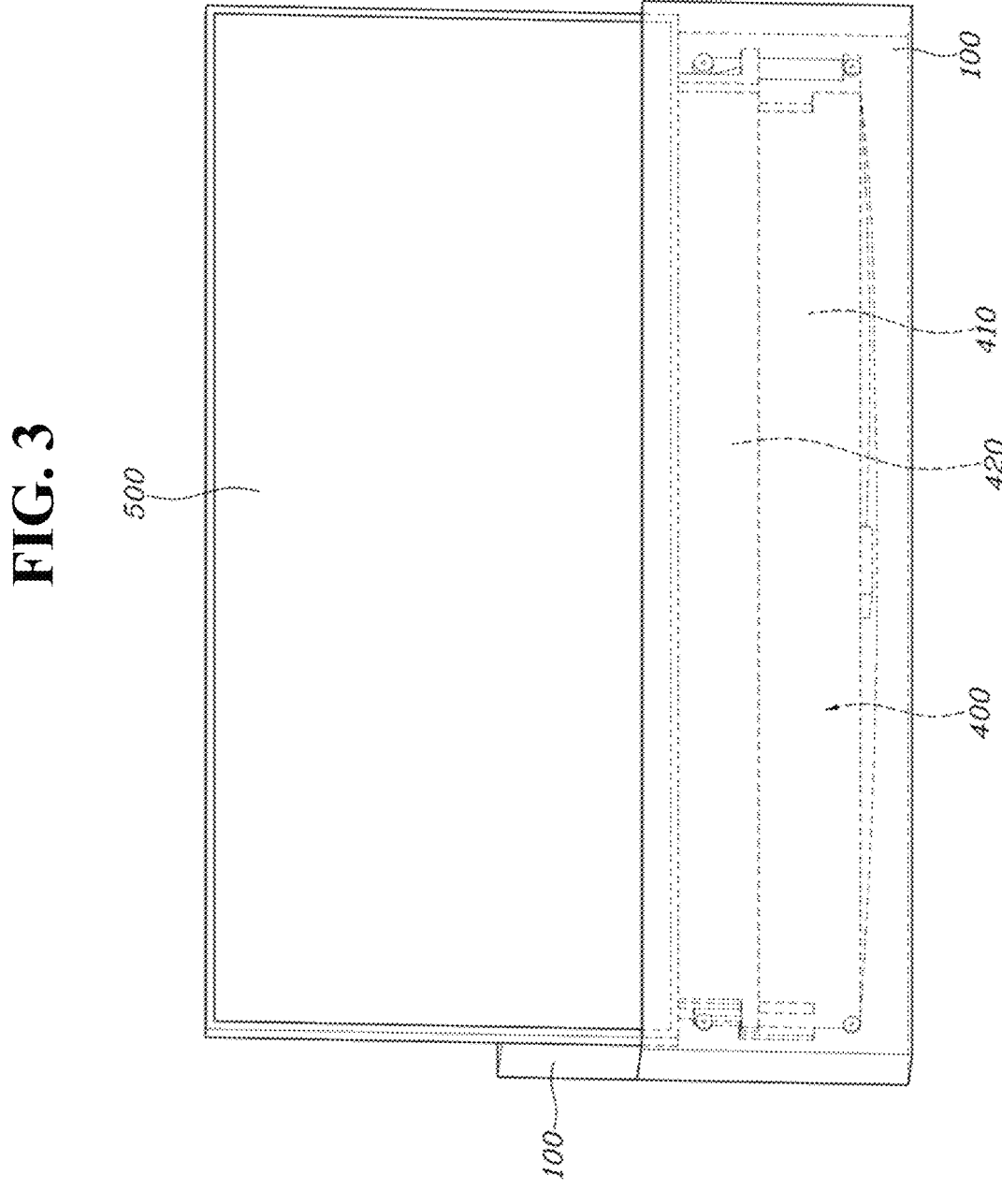
FIG. 3 illustrates an open mode state in which the monitor in FIG. 1 has moved upwards.
Figure 4:
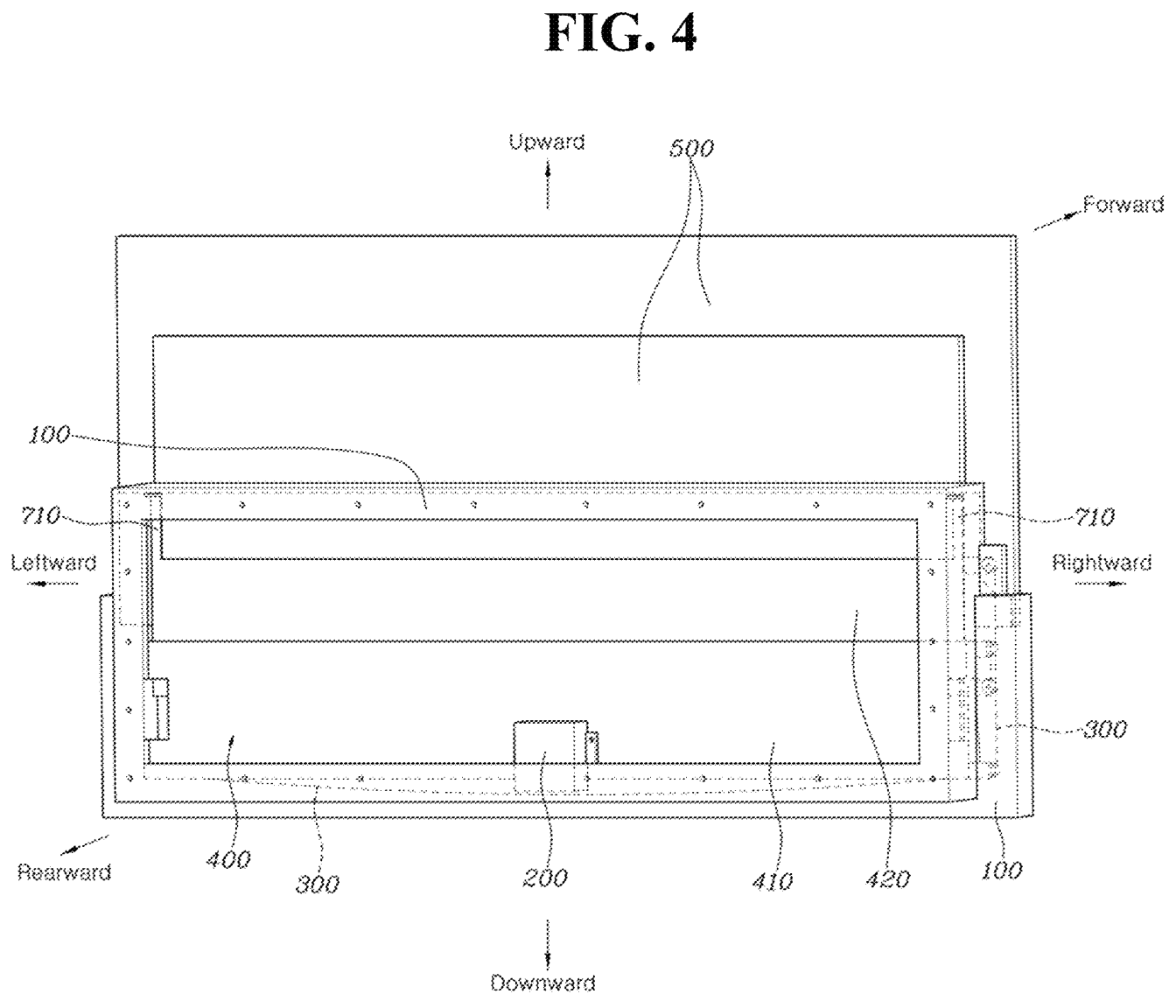
Figure 6:
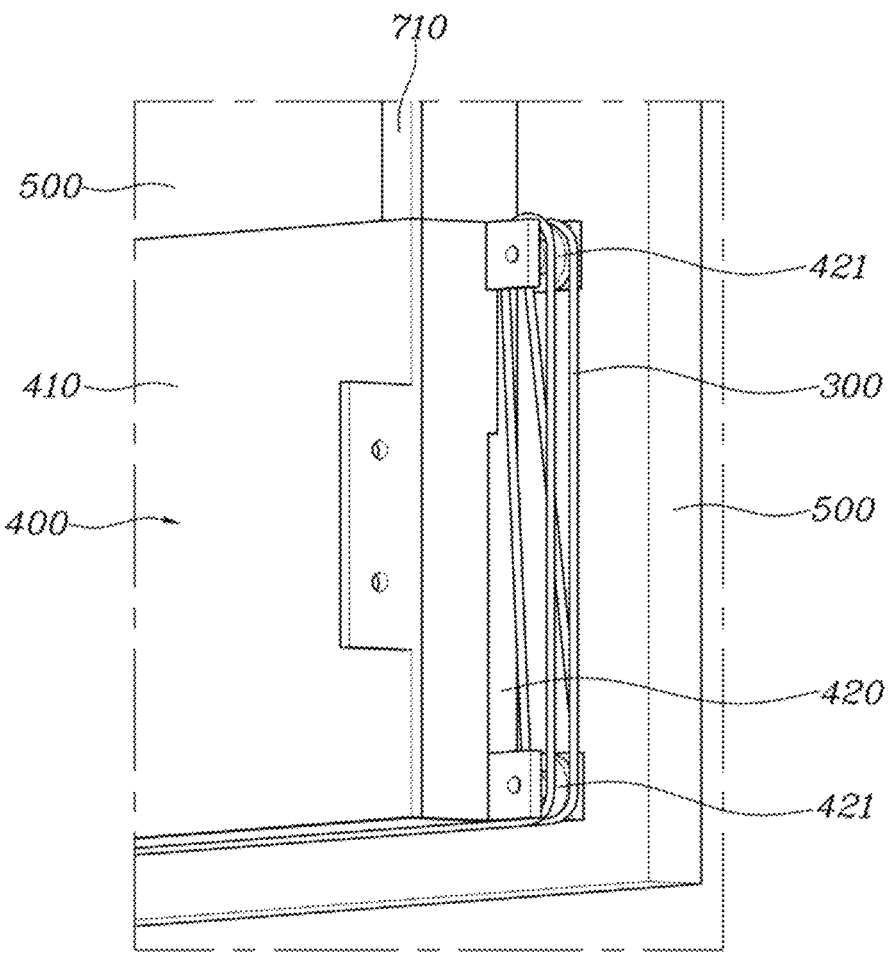
FIG. 6 illustrates the state of a monitor plate, a wire, and a monitor in a closed mode state of the monitor.

In connection with the monitor device according to the present disclosure, the wire 300 is pulled and wound around the driving pulleys 610 by operations of the actuator 200. The movable plate 420 moves upwards with regard to the fixed plate 410 by pulling the wire 300, and the monitor 500 moves upwards with regard to the movable plate 420. If the upward movement is completed, the monitor 500 protrudes upwards (open mode) as illustrated in FIG. 3 and FIG. 4.

Figure 2:
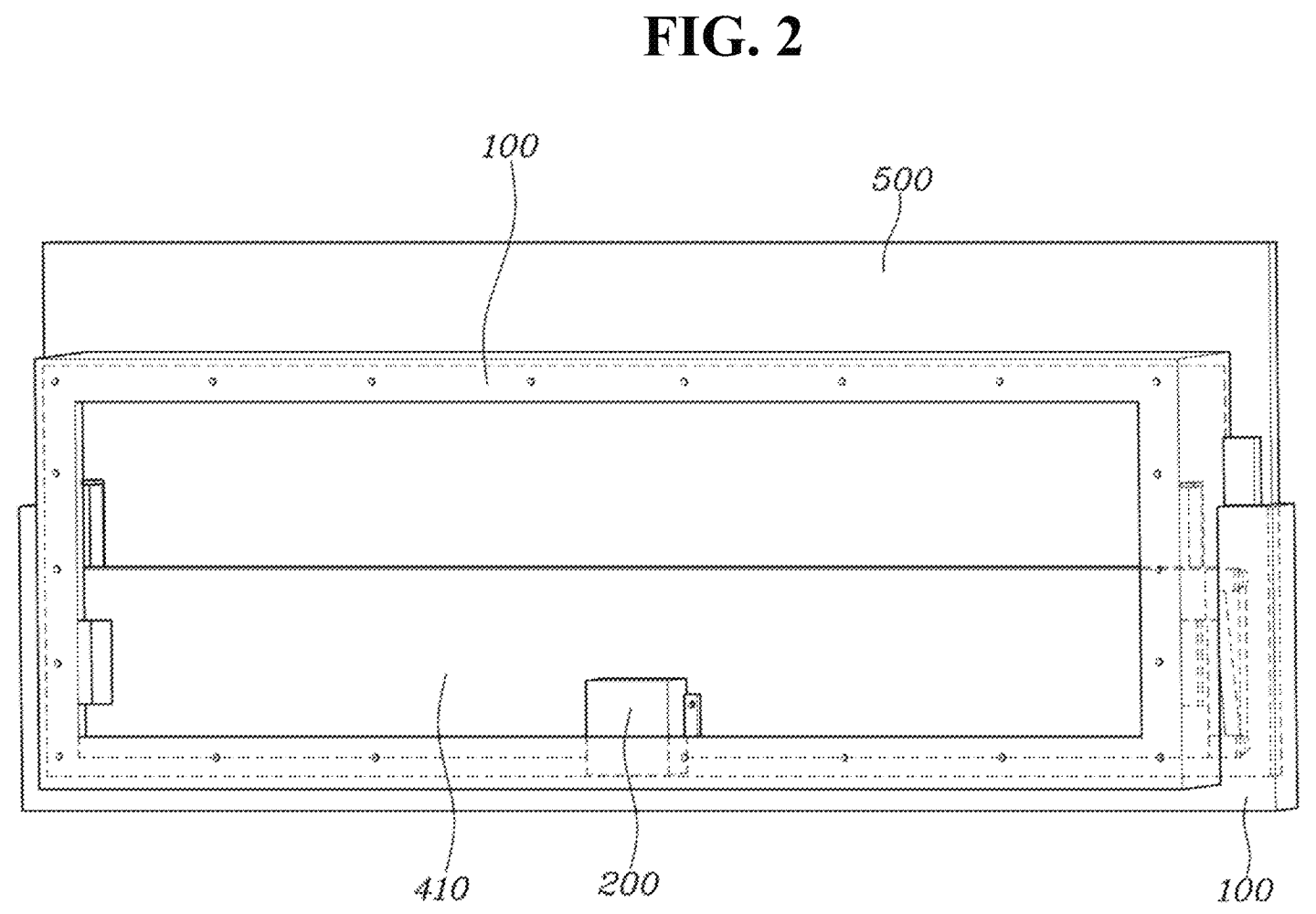

On the other hand, if the wire 300 is released from the driving pulleys 610 by operations of the actuator 200, the monitor 500 moves downwards by its own weight concurrently with the releasing of the wire 300, the movable plate 420 moves downwards with regard to the fixed plate 410 and overlaps the same in the forward/backward direction, and the monitor 300 completes or finishes moving downwards, thereby reaching a closed mode as in FIG. 1 or FIG. 2.

As described above, the vehicle monitor device according to the present disclosure is advantageous as follows: when the wire 300 is pulled and released by operations of the actuator 200, the fixed plate 410 moves linearly in a vertical direction with regard to the movable plate 420, the monitor plate 400 thus operates in a telescoping structure, and the monitor 500 moves linearly in a vertical direction with regard to the movable plate 420, thereby implementing an open mode and a closed mode. This is advantageous for a package by minimizing the operating space compared with a conventional structure based on a rack-and-pinion driving scheme, a lead screw driving scheme, or a link driving scheme.

There is another advantage in that an aesthetic appearance can be provided by applying a wire structure which is robust against noise and vibration.

There is another advantage in that operational stability and reliability can be secured by applying two (left and right) telescoping structures (boom structures), and it is possible to secure the maximum open length of the monitor 500 compared with a minimum package.

In addition, sufficient rigidity and rigidity can be secured by using a steel-based fixed plate 410 and a movable plate 420. This is advantageous in that, since no separate reinforcement member is necessary, the number of components, the weight, and the material cost can be reduced.

Although the present disclosure has been described and illustrated in conjunction with particular embodiments thereof, it will be apparent to those skilled in the art that various improvements and modifications may be made to the present disclosure without departing from the technical idea of the present disclosure defined by the appended claims.

What is claimed is:

1. A vehicle monitor device comprising:
an actuator attached to a case and configured to generate power;
a wire connected to the actuator and transferring the power from the actuator;
a monitor plate connected to the wire and having a telescoping structure that varies a length of the monitor plate depending on whether the wire is pulled or released; and
a monitor coupled to the monitor plate,
wherein the monitor plate comprises:
a fixed plate fixed to the case and connected to the wire; and
a movable plate overlapping and slidably connected directly to the fixed plate, connected to the wire, and configured to move in a first direction when the wire is pulled and move in a second direction when the wire is released,
wherein the fixed plate is configured to guide a movement of the movable plate in the first direction or second direction, and
wherein the monitor is attached to the fixed plate so as to move along with the movable plate when the fixed plate moves in the first direction or second direction.

2. The vehicle monitor device of claim 1, wherein the actuator is a bidirectional motor configured to rotate in clockwise and counterclockwise directions.

3. The vehicle monitor device of claim 1, wherein:
the actuator is attached to a lower end center of the case, and
the vehicle monitor device further comprises a driving pulley provided at a rotating shaft of the actuator such that the wire is wound around the driving pulley.

4. The vehicle monitor device of claim 1, further comprising:

a driving pulley configured to rotate by the power from the actuator;

a plurality of fixed plate pulleys rotatably coupled to upper and lower ends of left and right sides of the fixed plate and including a first fixed plate pulley; and a plurality of movable plate pulleys rotatably coupled to upper and lower ends of left and right sides of the movable plate and including a first movable plate pulley, wherein the wire has (1) a first end connected to the driving pulley and (2) a second end connected to the monitor via the first fixed plate pulley and the first movable plate pulley successively.

5. The vehicle monitor device of claim 4, wherein the plurality of fixed plate pulleys and the plurality of movable plate pulleys are spaced apart from each other and have center axes positioned eccentrically in a horizontal direction.

6. The vehicle monitor device of claim 4, wherein:

when the wire is pulled and wound around the driving pulley by the actuator, the movable plate moves upwardly with respect to the fixed plate, when the monitor moves upwardly with respect to the movable plate and completes an upward movement, the monitor operates in an open mode in which the monitor protrudes upwardly, when the wire is released by the actuator, the monitor moves downwardly driven by a weight of the wire, and the movable plate moves downwardly with respect to the fixed plate and overlaps the fixed plate, and when the monitor completes a downward movement, the monitor operates in a closed mode.

7. The vehicle monitor device of claim 1, wherein the wire, a connecting structure for the wire and the monitor plate, and a connecting structure for the wire and the monitor are laterally symmetrical with respect to the actuator.

8. A vehicle monitor device comprising:

an actuator attached to a case and configured to generate power;

a wire connected to the actuator and transferring the power from the actuator;

a monitor plate connected to the wire and having a telescoping structure that varies a length of the monitor plate depending on whether the wire is pulled or released; and a monitor coupled to the monitor plate, connected to the wire and configured to move (1) in a first direction when the wire is pulled and (2) in a second direction opposite to the first direction when the wire is released, wherein the monitor plate is configured to guide movements of the monitor in the first and second directions, wherein the monitor plate comprises:

a fixed plate attached to the case and connected to the wire; and a movable plate coupled to the monitor and connected to the wire, the movable plate overlapping the fixed plate and configured to move (1) in the first direction when the wire is pulled and (2) in the second direction when the wire is released, wherein the fixed plate is configured to guide movements of the monitor plate in the first and second directions, wherein the monitor is coupled to the movable plate so as to move in the first and second directions, and wherein vehicle monitor device further comprises:

a plurality of fixed plate guide protrusions extending inwardly from left and right surfaces of the fixed plate;

a plurality of movable plate guide grooves located on left and right surfaces of the movable plate, wherein the plurality of fixed plate guide protrusions are respectively disposed at the plurality of movable plate guide grooves;

a plurality of movable plate guide protrusions extending inwardly from the left and right surfaces of the fixed plate; and a plurality of monitor guide grooves located on left and right surfaces of the monitor, wherein the plurality of movable plate guide protrusions are respectively disposed at the plurality of monitor guide grooves, wherein the plurality of fixed plate guide protrusions, the plurality of movable plate guide grooves, the plurality of movable plate guide protrusions, and the plurality of monitor guide grooves extend in a vertical direction.

9. A vehicle monitor device comprising:

an actuator attached to a case and configured to generate power;

a wire connected to the actuator and transferring the power from the actuator;

a monitor plate connected to the wire and having a telescoping structure that varies a length of the monitor plate depending on whether the wire is pulled or released; and a monitor coupled to the monitor plate, connected to the wire and configured to move (1) in a first direction when the wire is pulled and (2) in a second direction opposite to the first direction when the wire is released, wherein the monitor plate is configured to guide movements of the monitor in the first and second directions, wherein the monitor plate comprises:

a fixed plate attached to the case and connected to the wire; and a movable plate coupled to the monitor and connected to the wire, the movable plate overlapping the fixed plate and configured to move (1) in the first direction when the wire is pulled and (2) in the second direction when the wire is released, wherein the fixed plate is configured to guide movements of the monitor plate in the first and second directions, and wherein the monitor is coupled to the movable plate so as to move in the first and second directions, and wherein vehicle monitor device further comprises:

a plurality of push rods extending upwardly from left and right upper ends of the movable plate; and a plurality of leaf springs disposed on left and right upper ends of the case and respectively positioned corresponding to the plurality of push rods, wherein, when the movable plate moves upwardly, the plurality of push rods pressurizes and compresses the plurality of leaf springs, and wherein, when the movable plate moves downwardly, the plurality of leaf springs are restored and push the plurality of push rods with an elastic force, which supplements a force necessary for an initial downward movement of the movable plate.

* * * * *